US012729108B2

(12) United States Patent
Garbarino et al.

(10) Patent No.: US 12,729,108 B2
(45) Date of Patent: Sep. 8, 2026

(54) MICROELECTROMECHANICAL ACCELEROMETER WITH FORCE FEEDBACK LOOP

(71) Applicant: STMicroelectronics International N.V., Geneva (CH)

(72) Inventors: Marco Garbarino, Cusago (IT); Gabriele Gattere, Castronno (IT)

(73) Assignee: STMicroelectronics International N.V., Geneva (CH)

( * ) Notice: Subject to any disclaimer, the term of this patent is extended or adjusted under 35 U.S.C. 154(b) by 283 days.

(21) Appl. No.: 18/663,961

(22) Filed: May 14, 2024

(65) Prior Publication Data

US 2024/0391757 A1 Nov. 28, 2024

(30) Foreign Application Priority Data

May 22, 2023 (IT) ........................ 102023000010326

(51) Int. Cl.
*B81B 3/00* (2006.01)
*G01P 15/125* (2006.01)

(52) U.S. Cl.
CPC .......... *B81B 3/0086* (2013.01); *G01P 15/125* (2013.01); *B81B 2201/0235* (2013.01); *B81B 2203/0172* (2013.01); *B81B 2203/0307* (2013.01); *B81B 2203/0315* (2013.01); *B81B 2203/04* (2013.01); *B81B 2203/055* (2013.01)

(58) Field of Classification Search
CPC ................. G01P 15/125; B81B 3/0086; B81B 2201/0235; B81B 2203/0172; B81B 2203/0307; B81B 2203/0315; B81B 2203/04; B81B 2203/055
USPC ....................................................... 73/514.32
See application file for complete search history.

(56) References Cited

U.S. PATENT DOCUMENTS

| | | | | |
|---|---|---|---|---|
| 6,360,605 | B1 | 3/2002 | Pinter et al. | |
| 7,078,778 | B2 | 7/2006 | Schenk | |
| 8,539,834 | B2 * | 9/2013 | Prandi | G01C 19/5726 73/504.12 |
| 9,234,755 | B2 * | 1/2016 | Prandi | G01C 19/56 |
| 10,274,512 | B2 | 4/2019 | Tocchio et al. | |

(Continued)

FOREIGN PATENT DOCUMENTS

| | | |
|---|---|---|
| CN | 107132372 A | 9/2017 |
| EP | 1832841 A1 | 9/2007 |

*Primary Examiner* — Peter J Macchiarolo
*Assistant Examiner* — Rodney T Frank
(74) *Attorney, Agent, or Firm* — Seed Intellectual Property Law Group LLP

(57) ABSTRACT

A microelectromechanical accelerometer includes a microstructure, having sensing terminals and driving terminals distinct from the sensing terminals, a supporting body and a movable mass, coupled to the supporting body so as to be able to oscillate according to a sensing axis with respect to a rest position, and a control unit coupled to the microstructure so as to form a force feedback loop configured to maintain the movable mass in the rest position. The movable mass includes a sensing structure and a driving structure, respectively coupled to the sensing terminals and to the driving terminals through capacitive couplings variable as a function of displacements of the movable mass from the rest position. The sensing structure and the driving structure are electrically insulated and rigidly coupled with each other.

21 Claims, 6 Drawing Sheets

(56) References Cited

U.S. PATENT DOCUMENTS

| | | | |
|---|---|---|---|
| 11,143,670 | B2 | 10/2021 | Choi et al. |
| 2008/0190198 | A1 | 8/2008 | Prandi et al. |
| 2009/0139331 | A1 | 6/2009 | Axelrod et al. |
| 2010/0213791 | A1 | 8/2010 | Kandori et al. |
| 2011/0197675 | A1 | 8/2011 | Caminada et al. |
| 2013/0229193 | A1 | 9/2013 | Kakimoto et al. |
| 2016/0091524 | A1 | 3/2016 | Kamada et al. |
| 2018/0031601 | A1 | 2/2018 | Anac et al. |
| 2018/0297838 | A1 | 10/2018 | Kautzsch et al. |
| 2020/0216310 | A1 | 7/2020 | Hocking et al. |
| 2021/0215735 | A1 | 7/2021 | Tseng et al. |
| 2021/0367536 | A1 | 11/2021 | Zhou et al. |
| 2022/0390483 | A1 | 12/2022 | Zhang et al. |
| 2023/0028797 | A1 | 1/2023 | Gattere et al. |
| 2024/0010490 | A1* | 1/2024 | Gattere ..................... B81B 7/02 |

* cited by examiner

MICROELECTROMECHANICAL ACCELEROMETER WITH FORCE FEEDBACK LOOP

BACKGROUND

Technical Field

Embodiments of the present disclosure relate to a microelectromechanical accelerometer with force feedback loop.

Description of the Related Art

There are different types of microelectromechanical accelerometers which differ in terms of structure and operating modes. Among these, such as the accelerometers with force feedback loop, are advantageous due to their high linearity.

Typically, an accelerometer with force feedback loop includes a movable mass, a charge-to-voltage converter, a feedback stage, and a driver stage.

The movable mass, of semiconductor material, is capacitively coupled to sensing electrodes and to driving electrodes with a variable sensing capacitance and driving capacitance, which are determined by the position of the movable mass with respect to a rest position. The charge-to-voltage converter is coupled to the sensing electrodes and transduces the displacements of the movable mass due to accelerations into electrical quantities (normally voltages). More precisely, the instant value of the sensing capacitance may be read by applying a reading signal, generally a square-wave voltage, to the movable mass. The reading signal moves charge packets which depend on the sensing capacitance and therefore on the position of the movable mass. The charge-to-voltage converter receives charge packets and converts them into sensing signals (voltages). On the basis of the sensing signals, the feedback stage determines feedback forces to be applied to bring the movable mass back to the rest position when the movable mass tends to displace due to accelerations. The driver stage applies the feedback forces to the movable mass by supplying feedback voltages to the driving electrodes. The intensity of the control action exerted by the feedback stage to maintain the movable mass in the rest position is indicative of the accelerations acting on the same movable mass.

However, the structure of known accelerometers has limitations which do not allow parameters of extreme interest for the market to be developed simultaneously. For various reasons, on the one hand performances, such as accuracy and sensitivity, and on the other consumptions, have conflicting aspects.

For example, an effective manner to increase the sensitivity of devices is to increase the amplitude of the reading signals. Since, for structural reasons, it is generally much simpler and preferred to use unipolar reading signals, generally positive voltages, an increase in amplitude translates into an increase in the average voltage applied to the movable mass. On the other hand, the request for reducing consumptions leads in the exact opposite direction. In fact, the feedback forces applied to the movable mass by the feedback stage through the driver stage depend on the difference between the common mode of the feedback voltages and the average value of the voltage on the movable mass, which coincides with the average value of the reading signal. Therefore, there is an interest in reducing the average value of the reading signal which conflicts with the interest in increasing the same value to improve sensitivity.

Another limitation is given by the fact that the noise of the driver stage influences the overall performances in terms of noise, due to the fact that the movable mass is conductive. To overcome this drawback, one solution is to increase the current of the driver stage. The current of the driver stage, which is variable with a wider bandwidth than the feedback loop bandwidth to be able to apply the suitable feedback forces, is generally supplied thanks to charge pump circuits (especially in the case of large full scale devices). While the static consumption of the charge pump circuits is not critical, the dynamic consumption is very high and heavily affects the overall consumption of the devices.

Another factor which affects the performances of the devices is due to the fact that the transfer function between the driving quantities and the forces applied to the movable mass is not ideal but contains spurious contributions which depend on the reading frequency of the reading signal applied to the movable mass. Unwanted signals at the reading frequency, for example due to noise, are in practice demodulated and brought back to the base band, superimposing on the useful signal.

BRIEF SUMMARY

Embodiments of the present disclosure provide a microelectromechanical accelerometer which allows the limitations described to be overcome or at least mitigated.

A microelectromechanical accelerometer may be summarized as including: a microstructure, wherein the microstructure includes: a supporting body having first sensing terminals, second sensing terminals, a first driving terminal, and a second driving terminal; a moveable mass coupled to the supporting body, the moveable mass configured to oscillate along a sensing axis, and includes: a first sensing mass; and a second sensing mass, the first and second sensing masses form a sensing structure and a driving structure, wherein the first sensing mass, the second sensing mass, and the driving structure are electrically insulated from each other and are all mechanically coupled; and a control unit, wherein the control unit includes: a charge-to-voltage converter; a controller; and a driver stage, the control unit coupled to the microstructure so as to form a force feedback loop configured to maintain the moveable mass in a rest position.

BRIEF DESCRIPTION OF THE SEVERAL VIEWS OF THE DRAWINGS

For a better understanding of embodiments of the present disclosure, embodiments are presented, by way of non-limiting example, with reference to the attached drawings, wherein.

DETAILED DESCRIPTION

The following description refers to the arrangement shown; consequently, expressions such as "above," "below,"

"top," "bottom," relate to the accompanying Figures and are not to be interpreted in a limiting manner.

Figure 1:
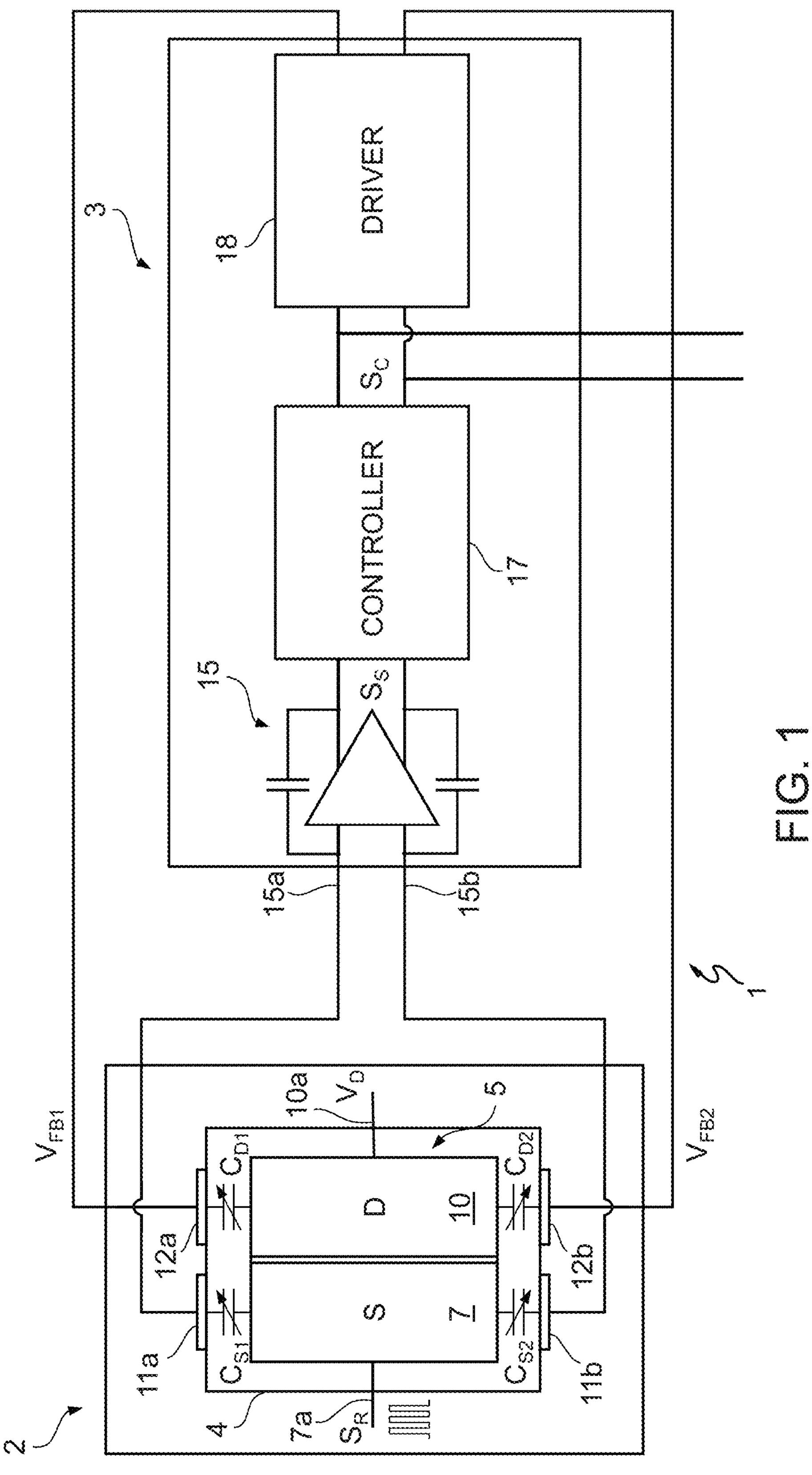
FIG. 1 is a simplified block diagram of a microelectromechanical accelerometer according to an embodiment of the present disclosure.

FIG. 1 shows a block diagram of a micro-electromechanical system (MEMS) accelerometer 1, here of uniaxial type, comprising a microstructure 2 and a control unit 3, mutually coupled. However, the MEMS accelerometer is not limited to the sole uniaxial accelerometers.

The microstructure 2 comprises a supporting body 4 and a movable mass 5, here illustrated only schematically. The movable mass 5 is coupled to the supporting body 4 so as to be able to oscillate along a sensing axis and comprises a sensing structure 7 and a driving structure 10, electrically insulated from each other and mechanically coupled to each other. In some embodiments, the sensing structure 7 and the driving structure 10 are rigidly coupled to each other.

The movable mass 5 is capacitively coupled to the supporting body 4 in a differential manner. More precisely, the supporting body 4 is provided with a first sensing terminal 11*a*, a second sensing terminal 11*b*, a first driving terminal 12*a* and a second driving terminal 12*b*.

The sensing structure 7 is capacitively coupled to the first sensing terminal 11*a* and the second sensing terminal 11*b*. Furthermore, the sensing structure 7 is provided with a reading terminal 7*a*, receiving a reading signal $S_R$, for example a square-wave signal with a frequency between 10 KHz and 1 MHz. A first sensing capacitance $C_{S1}$ and a second sensing capacitance $C_{S2}$ are present between the sensing structure 7 and the first sensing terminal 11*a* and between the sensing structure 7 and the second sensing terminal 11*b*. The first sensing capacitance $C_{S1}$ and the second sensing capacitance $C_{S2}$ vary in a differential manner as a function of the movements of the movable mass 5. In practice, due to a movement of the movable mass 5 along the sensing axis, the first sensing capacitance $C_{S1}$ increases (decreases) by an amount and the second sensing capacitance $C_{S2}$ decreases (increases) by the same amount.

Similarly, the driving structure 10 is coupled in a differential manner to the first driving terminal 12*a* and the second driving terminal 12*b*. Furthermore, the driving structure 10 is provided with a biasing terminal 10*a*, receiving a direct biasing voltage $V_D$. A first driving capacitance $C_{D1}$ and a second driving capacitance $C_{D2}$, varying in a differential manner as a function of the movements of the movable mass 5, are present between the driving structure 10 and the first driving terminal 12*a* and the second driving terminal 12*b*.

The control unit 3 comprises a charge-to-voltage converter 15, a controller 17 and a driver stage 18, which, with the microstructure 2, form a force feedback loop configured to maintain the movable mass 5 in a rest position.

The charge-to-voltage converter 15 is for example, a fully-differential operational amplifier in charge integrator configuration and has a first reading input 15*a* and a second reading input 15*b*, respectively coupled to the first sensing terminal 11*a* and the second sensing terminal 11*b* of the microstructure 2 to receive charge packets in response to switchings of the reading signal $S_R$. The charge-to-voltage converter 15 converts the received charge packets into a sensing signal $S_S$ which is supplied to the controller 17. The sensing signal $S_S$ is indicative of the position of the movable mass 5 with respect to the rest position.

On the basis of the sensing signal $S_S$, the controller 17 determines a control signal $S_C$ (normally a control voltage) indicative of the feedback forces to be applied to the movable mass 5 to bring the same movable mass 5 back to a rest position. The amplitude of the control signal $S_C$, which is made available on the output of the MEMS accelerometer 1, is also indicative of the acceleration acting on the MEMS accelerometer 1.

The driver stage 18 converts the control signal $S_C$ into a first feedback voltage $V_{FB1}$ and into a second feedback voltage $V_{FB2}$ which are applied respectively to the first driving terminal 12*a* and the second driving terminal 12*b* to bring the movable mass 5 back to the rest position.

The movable mass 5 allows removal of constraints between the signals which are applied for reading and for cancelling the displacements from the rest position. In fact, the movable mass 5 is a single rigid body, but the driving structure 10 of the movable mass 5 is electrically insulated from the sensing structure 7. This measure allows the reading signal $S_R$ and the feedback voltages $V_{FB1}$, $V_{FB2}$ (which determine the feedback forces applied to the movable mass 5) to be selected in an independent manner according to the design preferences. For example, the amplitude of the reading signal $S_R$ may be selected to obtain a high sensitivity, which leads to correspondingly high average values. The direct voltage of the driving structure may be selected in an independent manner and, may be maintained at a value such as to limit consumptions, such as those linked to the charge pump circuits to generate the variable components of the feedback voltages $V_{FB1}$, $V_{FB2}$ even at high frequency. Overall consumptions may be drastically reduced, from the order of milliamperes to the order of hundreds of microamperes. The insulation of the sensing structure 7 from the driving structure 10 therefore allows greater freedom of design and sensitivity and consumptions to be defined separately and without conflicting aspects.

For example, the amplitude of the reading signal $S_R$ may be chosen to obtain a desired sensitivity, without this affecting the level of the feedback voltages $V_{FB1}$, $V_{FB2}$ and therefore consumptions. The direct voltage of the driving structure 10 is in fact not bound to the average value of the reading signal $S_R$, thanks to the electrical insulation from the sensing structure 7, and may be chosen to obtain the desired feedback forces with the least energy expenditure. For example, it is possible to supply a high biasing voltage (that is static, therefore with low consumptions) and apply low, rapidly variable, feedback voltages $V_{FB1}$, $V_{FB2}$ to the driving terminals 12*a*, 12*b*.

The insulation between the sensing structure 7 and the driving structure 10 of the movable mass 5 also allows removal of spurious contributions linked to the reading signal $S_R$ from the transfer function between the driving quantities and the forces applied to the movable mass.

A further advantage is that the spurious effect of the sensing signal on the driving chain is removed, again due to the insulation described. In practice, the forces applied to the driving structure 10 depend exclusively on the action of the feedback loop and are not influenced by the square-wave reading signal.

Figure 2:
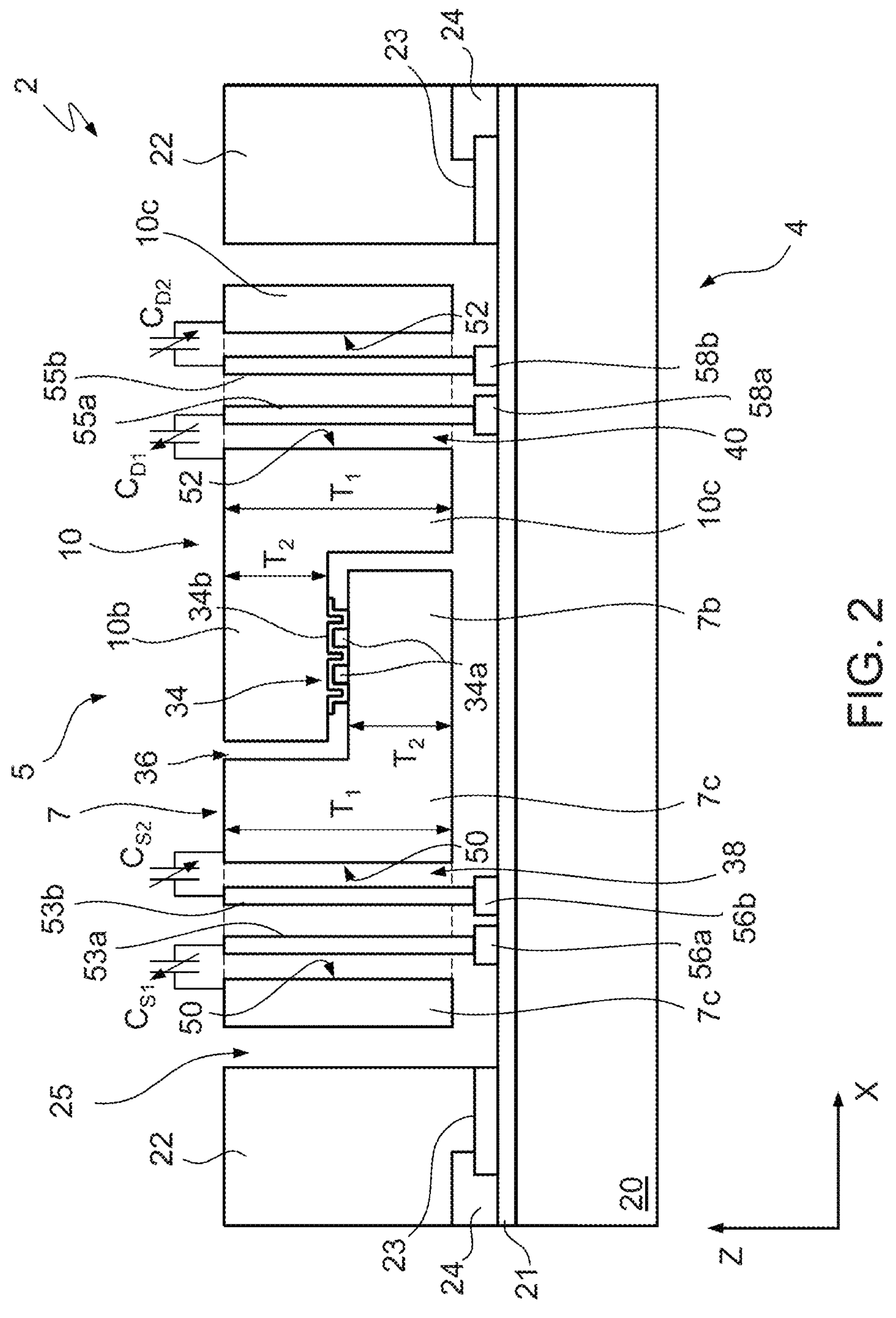
FIG. 2 is a cross-section through a component of the accelerometer of FIG. 1.
Figure 3:
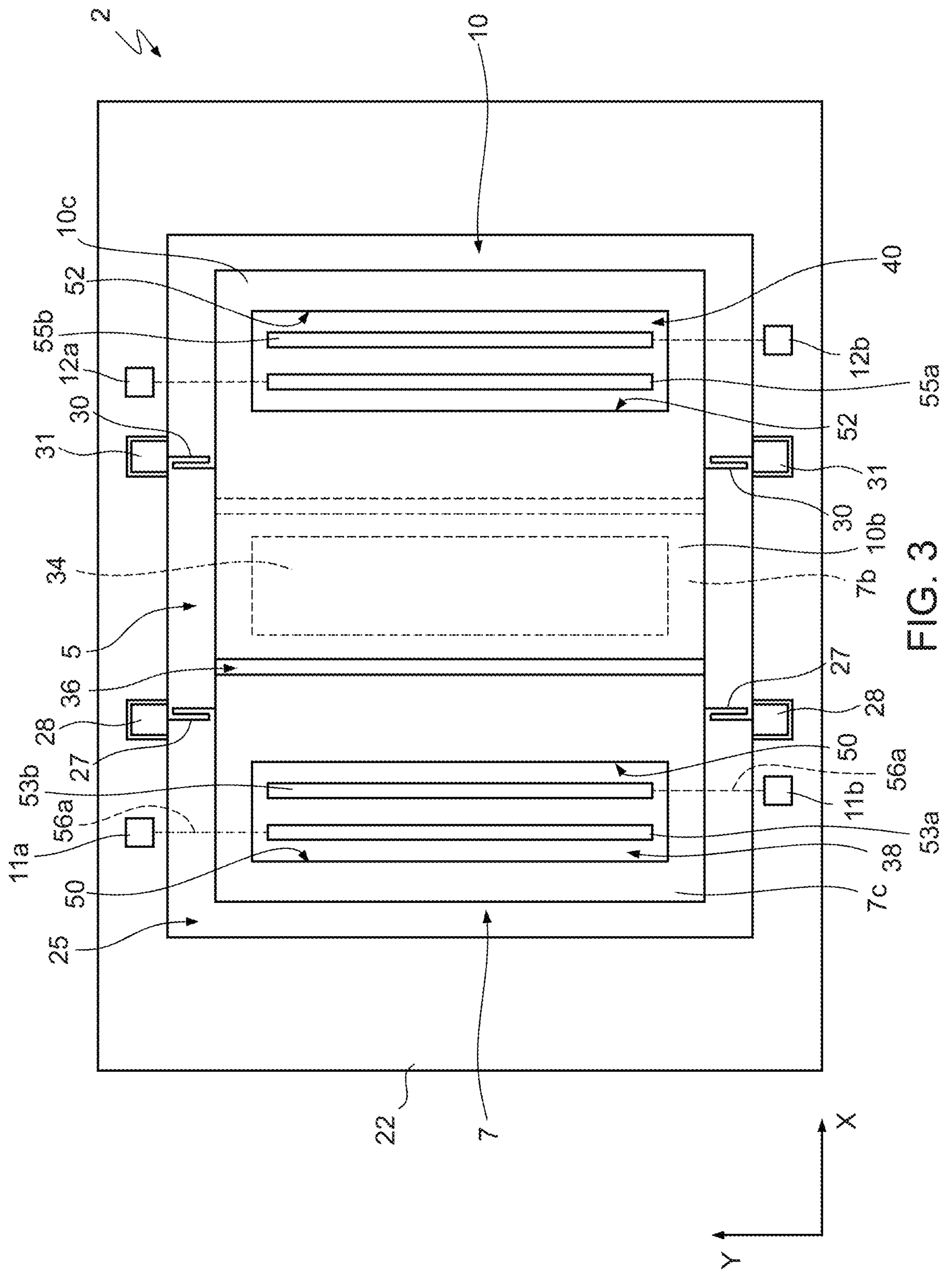
FIG. 3 is a top-plan view of the component of FIG. 2.

FIGS. 2 and 3 show the microstructure 2 according to an embodiment of the present disclosure in a Cartesian reference system XYZ comprising a first axis X, a second axis Y, and a third axis Z.

The microstructure 2 is formed by using MEMS technology, through micromachining techniques, starting from a body of semiconductor material, for example silicon.

The supporting body 4 comprises a substrate 20 of semiconductor material, for example monocrystalline silicon, an insulating layer 21 extending on the substrate 20, and a supporting frame 22.

The insulating layer 21 covers the substrate 20 and may include a single dielectric layer, for example silicon oxide, or a multilayer, for example a silicon oxide layer and a silicon nitride layer.

The supporting frame 22, for example of polycrystalline silicon, is fixed to the insulating layer 21 through conductive contact pads 23 and dielectric anchoring regions 24. The supporting frame 22 and the insulating layer 21 laterally and downwardly delimit a cavity 25 where the movable mass 5 is accommodated, suspended at a distance from the insulating layer 21.

In more detail, the sensing structure 7 of the movable mass 5 is coupled through flexures 27 to sensing anchors 28. The sensing anchors 28 are defined by respective portions of the supporting frame 22 insulated from the remaining portions and are connected, in a manner not illustrated for the sake of simplicity, to the reading terminal 7*a*.

The driving structure 10 of the movable mass 5 is coupled through flexures 30 to driving anchors 31. The sensing anchors 28 and the driving anchors 31 are defined by respective portions of the supporting frame 22 insulated from the remaining portions and are connected, in a manner not illustrated for the sake of simplicity, to the biasing terminal 10*a*.

The flexures 27, 30 are configured so as to allow the movable mass 5 to oscillate along the sensing axis, here parallel to the axis X, with respect to a rest position.

The electrical connection of the sensing anchors 28 to the reading terminal 7*a* and of the driving anchors 31 to the biasing terminal 10*a* may be obtained by buried connection lines (not shown) running on the insulating layer 21.

The movable mass 5 also comprises a mechanical coupling structure 34, of dielectric material, which rigidly connects the sensing structure 7 and the driving structure 10 to each other, so as to form a single rigid body. The sensing structure 7 and the driving structure 10 are mutually spaced and are not in direct contact with each other. The sensing structure 7 and the driving structure 10 are separated by a gap 36 and rigidly coupled to each other by the mechanical coupling structure 34, which is placed in the gap 36. The sensing structure 7 and the driving structure 10 are therefore electrically insulated from each other.

In more detail, the sensing structure 7 and the driving structure 10 have respective mechanical coupling portions 7*b*, 10*b* and respective capacitive coupling portions 7*c*, 10*c*. The capacitive coupling portions 7*c*, 10*c* have a first thickness $T_1$, equal to the thickness of the supporting frame 22, while the mechanical coupling portions 7*b*, 10*b* have a second thickness $T_2$ smaller than the first thickness $T_1$. In the non-limiting embodiment of FIGS. 2 and 3, the second thickness $T_2$ is equal for the mechanical coupling portions 7*b*, 10*b* and lower than half of the first thickness $T_1$.

The mechanical coupling portion 10*b* of the driving structure 10 is superimposed on the mechanical coupling portion 7*b* of the sensing structure 7 in the direction of the axis Z. The mechanical coupling structure 34 rigidly connects the mechanical coupling portion 7*b* of the sensing structure 7 and the mechanical coupling portion 10*b* of the driving structure 10 to each other across the gap 36.

In one embodiment, the mechanical coupling structure 34 comprises inner regions 34*a* and coating regions 34*b*, which may be of materials selectively etchable by different chemical species. For example, the inner regions 34*a* may be of silicon oxide and the coating regions 34*b* may be of silicon nitride. The inner regions 34*a* are formed on the mechanical coupling portion 7*b* of the sensing structure 7. The coating regions 34*b* conformally cover the inner regions 34*a* and are in contact with the mechanical coupling portion 10*b* of the driving structure 10. Spaces free from the coating region 34*b* between inner regions 34*a* may be occupied by indentations of the mechanical coupling portion 10*b*.

The capacitive coupling portions 7*c*, 10*c* have respective through openings 38, 40 which extend in the direction of the axis Z throughout the first thickness $T_1$ and have in plan-view a rectangular shape. In the direction of the sensing axis, i.e., in the direction of the axis X, the openings 38, 40 are delimited by respective flat walls 50, 52 perpendicular to the same sensing axis (i.e., parallel to the coordinate plane YZ).

The microstructure 2 comprises a first fixed sensing electrode 53*a*, a second fixed sensing electrode 53*b*, a first fixed driving electrode 55*a* and a second fixed driving electrode 55*b*, all rigidly connected to the supporting body 4.

The first fixed sensing electrode 53*a* and the second fixed sensing electrode 53*b* are defined by flat plates of semiconductor material, for example polycrystalline silicon, which extend substantially perpendicular to the sensing axis (parallel to the coordinate plane YZ). The first fixed sensing electrode 53*a* and the second fixed sensing electrode 53*b* are accommodated inside the opening 38 of the capacitive coupling portion 7*a* of the sensing structure 7 and face respective flat walls 50 delimiting the opening 38. Conductive lines 56*a*, 56*b* running on the dielectric layer 21 connect the first fixed sensing electrode 53*a* and the second fixed sensing electrode 53*b* to the first sensing terminal 11*a* and the second sensing terminal 11*b*, respectively. The sensing structure 7 is thus capacitively coupled to the first sensing terminal 11*a* and the second sensing terminal 11*b* with the first sensing capacitance $C_{S1}$ and with the second sensing capacitance $C_{S2}$ varying in a differential manner when the movable mass 5 oscillates along the sensing axis.

The first fixed driving electrode 55*a* and the second fixed driving electrode 55*b* are defined by flat plates of semiconductor material, for example polycrystalline silicon, which extend perpendicular to the sensing axis (parallel to the coordinate plane YZ). The first fixed driving electrode 55*a* and the second fixed driving electrode 55*b* are accommodated inside the opening 40 of the capacitive coupling portion 10*c* of the driving structure 10 and face respective flat walls 52 of the opening 40. Conductive lines 58*a*, 58*b* running on the dielectric layer 21 connect the first fixed driving electrode 55*a* and the second fixed driving electrode 55*b* to the first driving terminal 12*a* and the second driving terminal 12*b*, respectively. The driving structure 10 is thus capacitively coupled to the first driving terminal 12*a* and the second driving terminal 12*b* with the first driving capacitance $C_{D1}$ and with the second driving capacitance $C_{D2}$ varying in a differential manner when the movable mass 5 oscillates along the sensing axis.

Figure 4:
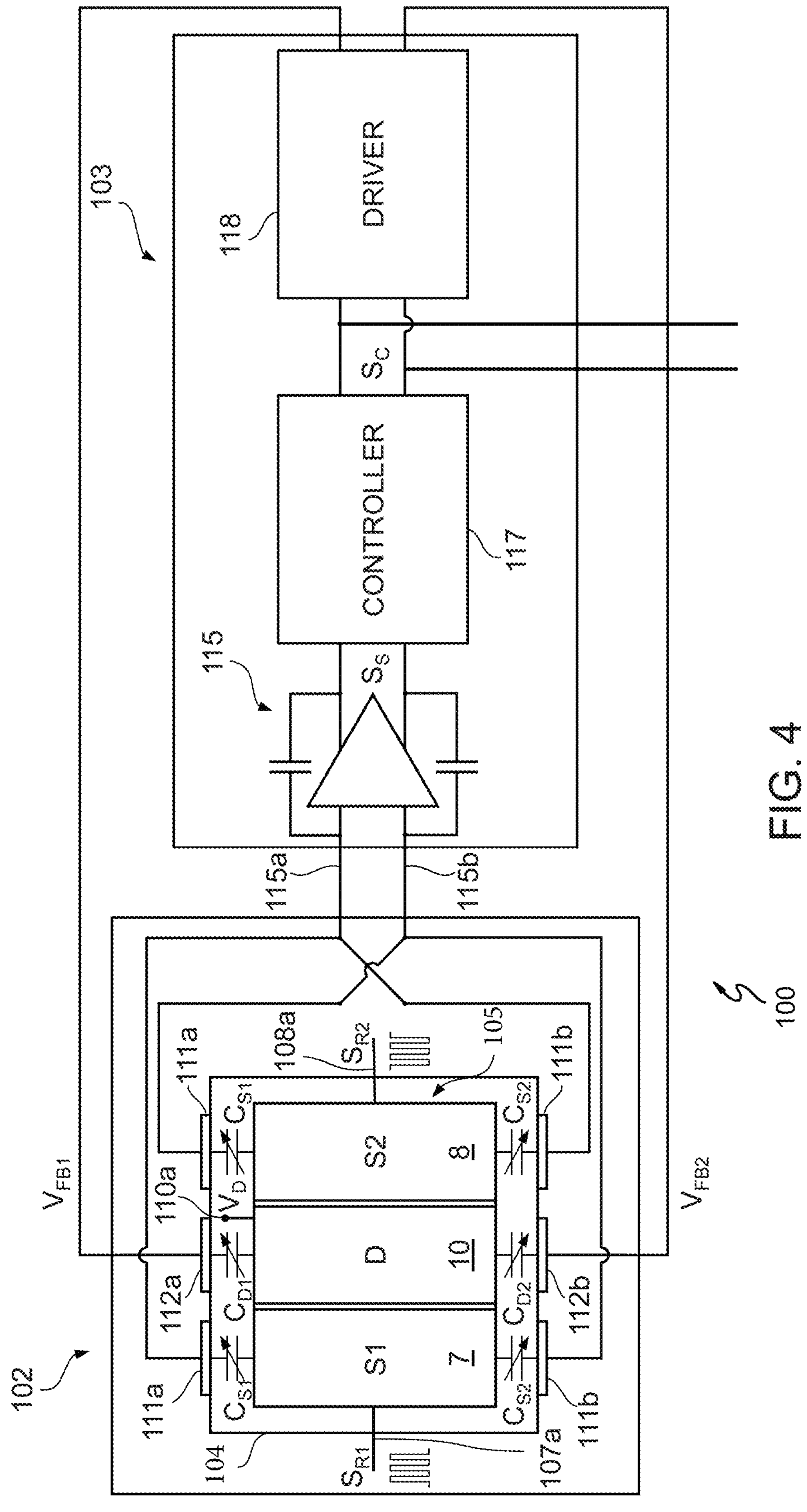
FIG. 4 is a simplified block diagram of a microelectromechanical accelerometer according to an alternative embodiment of the present disclosure.
Figure 5:
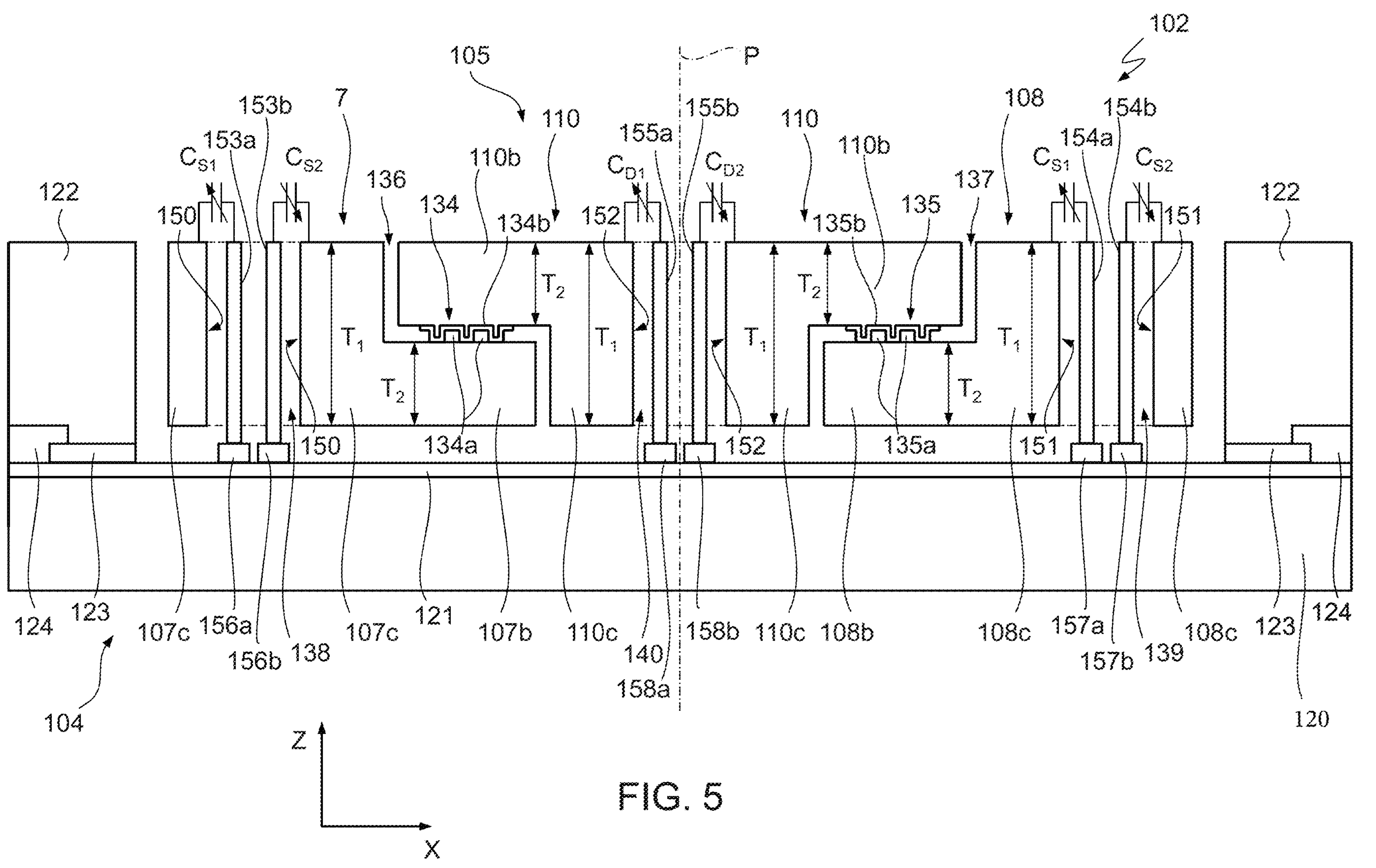
FIG. 5 is a cross-section through a component of the accelerometer of FIG. 4.
Figure 6:
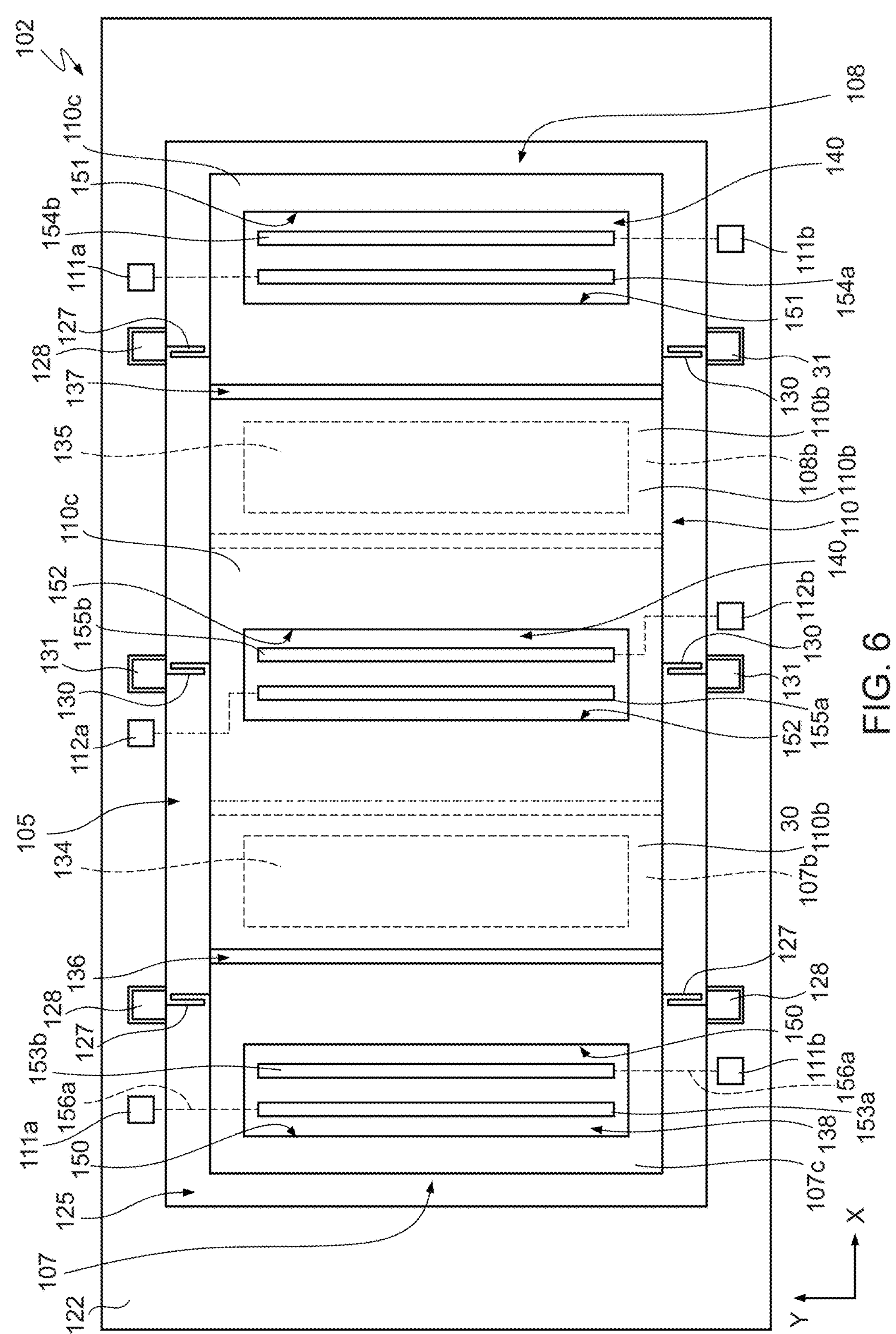
FIG. 6 is a top-plan view of the component of FIG. 5.

With reference to FIGS. 4-6, a microelectromechanical accelerometer in accordance with a different embodiment of the present disclosure is indicated by 100 and comprises a microstructure 102 and a control unit 103.

The microstructure 102 comprises a supporting body 104 and a movable mass 105, here illustrated only schematically. The movable mass 105 is coupled to the supporting body 104 so as to be able to oscillate along a sensing axis and comprises a first sensing mass 107, a second sensing mass 108, which form a sensing structure, and a driving structure 110. The first sensing mass 107, the second sensing mass 108 and the driving structure 110 are electrically insulated from each other and are all mechanically coupled, such as rigidly coupled, to each other.

The movable mass 105 is capacitively coupled to the supporting body 104 in a differential manner. More precisely, the supporting body 104 is provided with first sensing terminals 111*a*, second sensing terminals 111*b*, a first driving terminal 112*a* and a second driving terminal 112*b*.

The first sensing mass 107 and the second sensing mass 108 are each capacitively coupled to a respective first sensing terminal 111*a* and a respective second sensing terminal 111*b*. Furthermore, the first sensing mass 107 and the second sensing mass 108 are respectively provided with a first reading terminal 107*a*, receiving a first reading signal $S_{R1}$, and a second reading terminal 108*a*, receiving a second reading signal $S_{R2}$. The first reading signal $S_{R1}$ and the second reading signal $S_{R2}$ are, for example, square-wave signals with a frequency between 10 khz and 1 Mhz and are phase-shifted by 180° with respect to each other. Between each of the first sensing mass 107 and the second sensing mass 108 and the respective first sensing terminals 111*a* and second sensing terminals 111*b* there are present first sensing capacitances $C_{S1}$ and second sensing capacitances $C_{S2}$, varying in a differential manner as a function of the movements of the movable mass 105. The first sensing capacitances $C_{S1}$ (second sensing capacitances $C_{S2}$) vary from each other concordantly with and discordantly from the respective second sensing capacitances $C_{S2}$ (first sensing capacitances $C_{S1}$). Due to a movement of the movable mass 105 along the sensing axis, the first sensing capacitances $C_{S1}$ increase (decrease) by a same amount and the second sensing capacitances $C_{S2}$ decrease (increase) by the same amount.

Similarly, the driving structure 110 is coupled in a differential manner to the first driving terminal 112*a* and the second driving terminal 112*b*. Furthermore, the driving structure 110 is provided with a biasing terminal 110*a*, receiving a direct biasing voltage $V_D$. A first driving capacitance $C_{D1}$ and a second driving capacitance $C_{D2}$, varying in a differential manner as a function the movements of the movable mass 105, are present between the driving structure 110 and the first driving terminal 112*a* and the second driving terminal 112*b*. The first driving capacitance $C_{D1}$ and a second driving capacitance $C_{D2}$ vary from each other discordantly. Due to a movement of the movable mass 105 along the sensing axis, the first driving capacitance $C_{D1}$ increases (decreases) by an amount and the second driving capacitance $C_{D2}$ decreases (increases) by the same amount.

The control unit 103 comprises a charge-to-voltage converter 115, a controller 117 and a driver stage 118 which, with the microstructure 102, form a force feedback loop configured to maintain the movable mass 105 in a rest position, substantially as already described.

The charge-to-voltage converter 115 is, for example, a fully-differential operational amplifier in charge integrator configuration and is coupled to the microstructure 102 to receive charge packets in response to switchings of the reading signals $S_{R1}$, $S_{R2}$. The charge-to-voltage converter 115 converts the received charge packets into a sensing signal $S_S$ which is supplied to the controller 117. The sensing signal $S_S$ is indicative of the position of the movable mass 105 with respect to the rest position.

In more detail, the first sensing mass 107 and the second sensing mass 108 each have respective first sensing terminals 111*a* and second sensing terminals 111*b* one coupled to a first reading input 115*a* and the other to a second reading input 115*b* of the charge-to-voltage converter 115. Furthermore, of the first sensing terminals 111*a* and the second sensing terminals 111*b*, one is coupled to the first reading input 115*a* and the other is coupled to the second reading input 115*b*. In the embodiment of FIGS. 4-6, for example, the first sensing terminal 111*a* of the first sensing mass 107 and the second sensing terminal 111*b* of the second sensing mass 108 are coupled to the first reading input 115*a*, while the second sensing terminal 111*b* of the first sensing mass 107 and the first sensing terminal 111*a* of the second sensing mass 108 are coupled to the second reading input 115*b*.

On the basis of the sensing signal $S_S$, the controller 117 determines a control signal $S_C$ (usually a control voltage) indicative of feedback forces to be applied to the movable mass 105 to bring the same movable mass 105 back to a rest position. The amplitude of the control signal $S_C$, which is made available on the output of the accelerometer 100, is also indicative of the acceleration acting on the accelerometer 100.

The driver stage 118 converts the control signal $S_C$ into a first feedback voltage $V_{FB1}$ and into a second feedback voltage $V_{FB2}$ which are applied respectively to the first driving terminal 112*a* and the second driving terminal 112*b* to bring the movable mass 105 back to the rest position.

The movable mass 105, in addition to removing the constraints between the signals which are applied for reading and for canceling the displacements from the rest position as already described, enables correct continuous-time operation, which is difficult and complex to implement with the structure of the known accelerometers and would instead be advantageous for a better sensitivity with the same consumption with respect to the discrete-time operation. Although the reading of the accelerometer is based on capacitive coupling variable in a differential manner, modulation through the reading signals produces a common-mode component due to the capacitance at rest which predominates, but is not useful for the purposes of sensing and causes consumptions in particular by the charge-to-voltage converter. The common-mode component should therefore be compensated and, in continuous-time operation, this may be done in two manners, again including compensation capacitances which are coupled to the inputs of the charge-to-voltage converter and replicate the capacitances between the supporting body and the movable mass in the rest position.

In a first solution, the compensation capacitances are integrated in the (ASIC, Application Specific Integrated Circuit) chip of the charge-to-voltage converter and receive compensation signals equal to the reading signal, but phase-shifted by 180°. Since the compensation capacitances and the movable mass, with the associated sensing capacitances, cannot be formed by using the same technology, mismatches may easily occur which, in continuous-time operation, worsen the noise and penalize the performances.

Another known solution consists in forming a microstructure with two identical movable masses, electrically and mechanically decoupled. The two movable masses have sensing terminals connected to the charge-to-voltage converter so as to cancel the common mode and amplify the differential contributions and receive respective reading signals mutually phase-shifted by 180°. In this case, the matching between the capacitances is much more accurate, but the control stage tends to cancel the overall displacement of the two movable masses and not the displacement of each of the two separately. In fact, the charge-to-voltage converter receives the sum of the charge contributions due to the displacements of the two movable masses and is not able to distinguish the origin. Despite the action of the control stage, therefore, due to unavoidable imperfections, the masses may find themselves in oscillation with even wide displacements with respect to the respective rest positions, with results that may range from a lower linearity than expected up to unreliable readings (for example, if an acceleration triggers phase-opposition oscillations of the movable masses, the accelerometer output may be zero).

In the movable mass 105, on the other hand, the first sensing mass 107 and the second sensing mass 108 are both rigidly coupled to the driving structure 110 and, consequently, also to each other. In addition to the advantage of a very accurate matching between capacitances, the mechanical constraint ensures that the first sensing mass 107 and the second sensing mass 108 always move in-phase and without relative displacements. Therefore, the overall displacement of the movable mass 105 coincides with the displacements of each of the first sensing mass 107 and the second sensing mass 108, the action of the force feedback loop is effective and the readings are correct.

FIGS. 5 and 6 show the microstructure 102 according to an alternative embodiment of the present disclosure in a Cartesian reference system XYZ comprising a first axis X, a second axis Y, and a third axis Z.

The microstructure 102 is formed in MEMS technology, through micromachining techniques, starting from a body of semiconductor material, for example silicon.

The supporting body 104 comprises a substrate 120 of semiconductor material, for example monocrystalline silicon, an insulating layer 121, extending on the substrate 120, and a supporting frame 122.

The insulating layer 121 covers the substrate 120 and may include a single dielectric layer, for example silicon oxide, or a multilayer, for example a silicon oxide layer and a silicon nitride layer.

The supporting frame 122, for example of polycrystalline silicon, is fixed to the insulating layer 121 through conductive contact pads 123 and dielectric anchoring regions 124. The supporting frame 122 and the insulating layer 121 laterally and downwardly delimit a cavity 125 where the movable mass 105 is accommodated, suspended at a distance from the insulating layer 121.

In more detail, the first sensing mass 107 and the second sensing mass 108 of the movable mass 105 are coupled through flexures 127 to sensing anchors 128. The sensing anchors 128 are defined by respective portions of the supporting frame 122 insulated from the remaining portions and are connected, in a manner not illustrated for the sake of simplicity, to the reading terminal 107*a* (for the first sensing mass 107) and to the second reading terminal 108*a* (for the second sensing mass 108).

The driving structure 110 of the movable mass 105 is coupled through flexures 130 to driving anchors 131. The sensing anchors 128 and the driving anchors 131 are defined by respective portions of the supporting frame 122 insulated from the remaining portions and are connected, in a manner not illustrated for the sake of simplicity, to the biasing terminal 110*a*.

The flexures 127, 130 are configured so as to allow the movable mass 105 to oscillate along the sensing axis, here parallel to the axis X, with respect to a rest position.

The movable mass 105 also comprises mechanical coupling structures 134, 135 of dielectric material, which rigidly connect the first sensing mass 107, the second sensing mass 108 and the driving structure 110 to each other, so as to form a single rigid body specular symmetrical with respect to a median plane P perpendicular to the sensing axis (and therefore to the axis X).

In more detail, the first sensing mass 107 and the second sensing mass 108 are arranged in a specular symmetrical manner on opposite sides of the driving structure 110 with respect to the median plane P of the movable mass 105. The driving structure 110 is itself specular symmetrical with respect to the median plane P.

The first sensing mass 107, the second sensing mass 108 and the driving structure 110 are mutually spaced and are not in direct contact with each other. The first sensing mass 107 and the driving structure 110 are separated by a gap 136 and are rigidly coupled to each other by the mechanical coupling structure 134, which is placed in the gap 136. The second sensing mass 108 and the driving structure 110 are separated by a gap 137 and are rigidly coupled to each other by the mechanical coupling structure 135, which is placed in the gap 137.

The first sensing mass 107, the second sensing mass 108 and the driving structure 110 are thus electrically insulated from each other.

In more detail, the first sensing mass 107, the second sensing mass 108 and the driving structure 110 have respective mechanical coupling portions 107*b*, 108*b*, 110*b* and respective capacitive coupling portions 107*c*, 108*c*, 110*c*. The capacitive coupling portions 107*c*, 108*c*, 110*c* have a first thickness $T_1$, equal to the thickness of the supporting frame 122, while the mechanical coupling portions 107*b*, 108*b*, 110*b* have a second thickness $T_2$ smaller than the first thickness $T_1$. In the non-limiting embodiment of FIGS. 4 and 5, the second thickness $T_2$ is equal for the mechanical coupling portions 107*b*, 108*b*, 110*b* and lower than half of the first thickness $T_1$.

The driving structure 110 has two mechanical coupling portions 110*b* which extend symmetrically in opposite directions with respect to the median plane P. In the direction of the axis Z, the mechanical coupling portions 110*b* of the driving structure 110 are superimposed one on the mechanical coupling portion 107*b* of the first sensing mass 107 and the other on the mechanical coupling portion 108*b* of the second sensing mass 108. The mechanical coupling structure 134 rigidly connects the mechanical coupling portion 107*b* of the first sensing mass 107 to the respective mechanical coupling portion 110*b* of the driving structure 110 across the gap 136. The mechanical coupling structure 135 rigidly connects the mechanical coupling portion 108*b* of the second sensing mass 108 to the respective mechanical coupling portion 110*b* of the driving structure 110 across the gap 137.

In one embodiment, the mechanical coupling structures 134, 135 comprise respective inner regions 134*a*, 135*a* and coating regions 134*b*, 135*b* of materials selectively etchable by different chemical species. The inner regions 134*a*, 135*a* are respectively formed on the mechanical coupling portion 107*b* of the first sensing mass 107. The coating regions 134*b* conformally cover the inner regions 134*a* and are in contact with the mechanical coupling portion 110*b* of the driving structure 110. Spaces free from the coating region 134*b* between inner regions 134*a* may be occupied by indentations of the mechanical coupling portions 110*b*.

The capacitive coupling portions 107*c*, 108*c*, 110*c* have respective through openings 138, 139, 140 which extend in the direction of the axis Z throughout the first thickness $T_1$ and have in plan a rectangular shape. In the direction of the sensing axis, i.e., in the direction of the axis X, the openings 138, 139, 140 are delimited by respective flat walls 150, 151, 152 perpendicular to the same sensing axis (i.e., parallel to the coordinate plane YZ).

The microstructure 102 comprises first fixed sensing electrodes 153*a*, 154*a*, second fixed sensing electrodes 153*b*, 154*b*, a first fixed driving electrode 155*a* and a second fixed driving electrode 155*b*, all rigidly connected to the supporting body 104.

The fixed sensing electrodes 153*a*, 154*a*, 153*b*, 154*b* and the fixed driving electrodes 155*a*, 155*b* are defined by flat plates of semiconductor material, for example polycrystalline silicon, which extend perpendicular to the sensing axis (parallel to the coordinate plane YZ).

The first fixed sensing electrode 153*a* and the second fixed sensing electrode 153*b* are accommodated inside the opening 138 of the capacitive coupling portion 107*c* of the first sensing mass 107 and face respective flat walls 150 delimiting the opening 138. Conductive lines 156*a*, 156*b* running on the dielectric layer 121 connect the first fixed sensing electrode 153*a* and the second fixed sensing electrode 153*b* to the first sensing terminal 111*a* and the second sensing terminal 111*b* of the first sensing mass 107, respectively. The first sensing mass 107 is thus capacitively coupled to the first sensing terminal 111*a* and the second sensing terminal 111*b* with the first sensing capacitance $C_{S1}$ and with the second sensing capacitance $C_{S2}$ varying in a differential manner when the movable mass 105 oscillates along the sensing axis.

The first fixed sensing electrode 154*a* and the second fixed sensing electrode 154*b* are accommodated inside the opening 139 of the capacitive coupling portion 108*c* of the second sensing mass 108 and face respective flat walls 151 delimiting the opening 139. Conductive lines 156*a*, 156*b* running on the dielectric layer 121 connect the first fixed sensing electrode 154*a* and the second fixed sensing electrode 154*b* to the first sensing terminal 111*a* and the second sensing terminal 111*b* of the second sensing mass 108, respectively. The second sensing mass 108 is thus capacitively coupled to the first sensing terminal 111*a* and the second sensing terminal 111*b* with the first sensing capacitance $C_{S1}$ and with the second sensing capacitance $C_{S2}$ varying in a differential manner when the movable mass 105 oscillates along the sensing axis.

The first fixed driving electrode 155*a* and the second fixed driving electrode 155*b* are accommodated inside the opening 140 of the capacitive coupling portion 110*c* of the driving structure 110 and face respective flat walls 151 of the opening 140. Conductive lines 158*a*, 158*b* running on the dielectric layer 121 connect the first fixed driving electrode 155*a* and the second fixed driving electrode 155*b* to the first driving terminal 112*a* and the second driving terminal 112*b*, respectively. The driving structure 110 is thus capacitively coupled to the first driving terminal 112*a* and the second driving terminal 112*b* with the first driving capacitance $C_{D1}$ and with the second driving capacitance $C_{D2}$ varying in a differential manner when the movable mass 105 oscillates along the sensing axis.

Finally, it is clear that modifications and variations may be made to the microelectromechanical accelerometer described, without departing from the scope of the present disclosure, as defined in the attached claims.

For the sake of simplicity, reference has been made in the preceding description to uniaxial accelerometers. However, it is understood that the present disclosure may equally be applied to multi-axial accelerometers.

A microelectromechanical accelerometer may be summarized as including: a microstructure (2; 102), provided with sensing terminals (11*a*, 11*b*; 111*a*, 111*b*) and driving terminals (12*a*, 12*b*; 112*a*, 112*b*) distinct from the sensing terminals (11*a*, 11*b*; 111*a*, 111*b*) and including a supporting body (4; 104) and a movable mass (5; 105), coupled to the supporting body (4; 104) so as to be able to oscillate according to a sensing axis (X) with respect to a rest position; and a control unit (3; 103) coupled to the microstructure (2; 102) so as to form a force feedback loop configured to maintain the movable mass (5; 105) in the rest position; wherein the movable mass (5; 105) includes: a sensing structure (7; 107, 108) coupled to the sensing terminals (11*a*, 11*b*; 111*a*, 111*b*) through a sensing capacitive coupling ($C_{S1}$, $C_{S2}$) variable as a function of displacements of the movable mass (5; 105) from the rest position; and a driving structure (10; 110) coupled to the driving terminals (12*a*, 12*b*; 112*a*, 112*b*) through a driving capacitive coupling ($C_{D1}$, $C_{D2}$) variable as a function of displacements of the movable mass (5; 105) from the rest position; wherein the sensing structure (7; 107, 108) and the driving structure (10; 110) are electrically insulated from and rigidly coupled to each other.

The control unit (3; 103) may be coupled to the sensing terminals (11*a*, 11*b*; 111*a*, 111*b*) and the driving terminals (12*a*, 12*b*; 112*a*, 112*b*) of the movable mass (5; 105) and may be configured to sense displacements of the movable mass (5; 105) from the rest position through the sensing terminals (11*a*, 11*b*; 111*a*, 111*b*) and to apply feedback forces to the movable mass (5; 105) through feedback signals ($V_{FB1}$, $V_{FB2}$) supplied to the driving terminals (12*a*, 12*b*; 112*a*, 112*b*).

The control unit (3; 103) may include: a sensing device (15; 115) coupled to the sensing terminals (11*a*, 11*b*; 111*a*, 111*b*) of the movable mass (5; 105) and configured to supply a sensing signal ($S_S$) as a function of the displacements of the movable mass (5; 105) from the rest position; and a control device (17, 18; 117, 118) coupled to the driving terminals (12*a*, 12*b*; 112*a*, 112*b*) of the movable mass (5; 105) and configured to supply the feedback signals ($V_{FB1}$, $V_{FB2}$) as a function of the sensing signal ($S_S$).

The microstructure (2; 102) may include fixed driving electrodes (55*a*, 55*b*; 155*a*, 155*b*) rigidly connected to the supporting body (4; 104) and coupled to the driving terminals (12*a*, 12*b*; 112*a*, 112*b*) and the driving structure (10; 110) may be capacitively coupled to the fixed driving electrodes (55*a*, 55*b*; 155*a*, 155*b*) through the driving capacitive coupling ($C_{D1}$, $C_{D2}$) in a differential manner.

The fixed driving electrodes (55*a*, 55*b*; 155*a*, 155*b*) may be defined by flat semiconductor plates perpendicular to the sensing axis (X), wherein the driving structure (10; 110) may have a through opening (40; 140) and the fixed driving electrodes (55*a*, 55*b*; 155*a*, 155*b*) may be accommodated inside the through opening (40; 140) of the driving structure (10; 110) and may be capacitively coupled to respective walls (52; 152) of the through opening (40; 140).

The microstructure (2; 102) may include fixed sensing electrodes (53*a*, 53*b*; 153*a*, 153*b*, 154*a*, 154*b*) rigidly connected to the supporting body (4; 104) and coupled to the sensing terminals (11*a*, 11*b*; 111*a*, 111*b*) and the sensing structure (7; 107, 108) may be capacitively coupled to the fixed sensing electrodes (53*a*, 53*b*; 153*a*, 153*b*, 154*a*, 154*b*) through the sensing capacitive coupling ($C_{S1}$, $C_{S2}$) in a differential manner.

The fixed sensing electrodes (53*a*, 53*b*; 153*a*, 153*b*, 154*a*, 154*b*) may be defined by flat semiconductor plates perpendicular to the sensing axis (X), wherein the sensing structure (7; 107, 108) may have a through opening (38; 138, 139) and the fixed sensing electrodes (53*a*, 53*b*; 153*a*, 153*b*, 154*a*, 154*b*) may be accommodated inside the through opening (38; 138, 139) of the sensing structure (7; 107, 108) and may be capacitively coupled to respective walls (50; 150, 151) delimiting the through opening (38; 138, 139) and perpendicular to the sensing axis (X).

The sensing structure (107, 108) may include a first sensing mass (107) and a second sensing mass (108), both rigidly coupled to the driving structure (110) and electrically insulated from the driving structure (110) and from each other.

The sensing terminals (11*a*, 11*b*; 111*a*, 111*b*) may include first sensing terminals (111*a*) and second sensing terminals (111*b*); the first sensing mass (107) is capacitively coupled to a respective one of the sensing terminals (111*a*) and a respective one of the second sensing terminals (111*b*); the second sensing mass (108) is capacitively coupled to a respective one of the first sensing terminals (111*a*), distinct from the first sensing terminal (111*a*) of the first sensing mass (107), and to a respective one of the second sensing terminals (111*b*), distinct from the second sensing terminal (111*b*) of the first sensing mass (107); the first sensing terminal (111*a*) of the first sensing mass (107) and the second sensing terminal (111*b*) of the second sensing mass (108) are coupled to a first reading input (115*a*) of the control unit (3; 103); the first sensing terminal (111*a*) of the second sensing mass (108) and the second sensing terminal (111*b*) of the first sensing mass (107) are coupled to a second reading input (115*b*) of the control unit (3; 103).

The fixed sensing electrodes (153*a*, 153*b*, 154*a*, 154*b*) may include first fixed sensing electrodes (153*a*, 154*a*) and second fixed sensing electrodes (153*b*, 154*b*); the first sensing mass (107) is capacitively coupled to a respective one of the first fixed sensing electrodes (153*a*) and to a respective one of the second fixed sensing electrodes (153*b*); the second sensing mass (108) is capacitively coupled to a respective one of the first fixed sensing electrodes (154*a*), distinct from the first fixed sensing electrode (154*a*) coupled to the first sensing mass (107), and to a respective one of the second fixed sensing electrodes (153*b*, 154*b*), distinct from the second fixed sensing electrode (153*b*) coupled to the first sensing mass (107).

The first sensing mass (107) and the second sensing mass (108) each may have a respective through opening (138, 139); the first fixed sensing electrode (153*a*) and the second fixed sensing electrode (153*b*) coupled to the first sensing mass (107) may be accommodated inside the through opening (138) of the first sensing mass (107); the first fixed sensing electrode (154*a*) and the second fixed sensing electrode (154*b*) coupled to the second sensing mass (108) may be accommodated inside the through opening (138) of the second sensing mass (108); and the first fixed sensing electrodes (153*a*, 154*a*) and second fixed sensing electrodes (153*b*, 154*b*) may be capacitively coupled to respective walls (150, 151) delimiting the through openings (138, 139) and perpendicular to the sensing axis (X) wherein the first fixed sensing electrodes (153*a*, 154*a*) and second fixed sensing electrodes (153*b*, 154*b*) may be respectively accommodated.

The first fixed sensing electrode (153*a*) and the second fixed sensing electrode (153*b*) coupled to the first sensing mass (107) may be respectively connected to the first sensing terminal (111*a*) and to the second sensing terminal (111*b*) of the first sensing mass (107); and the first fixed sensing electrode (154*a*) and the second fixed sensing electrode (154*b*) coupled to the second sensing mass (108) may be respectively connected to the first sensing terminal (111*a*) and to the second sensing terminal (111*b*) of the second sensing mass (108).

The sensing capacitive coupling ($C_{S1}$, $C_{S2}$) may include first capacitances ($C_{S1}$) between the first sensing mass (107) and the respective first sensing terminal (111*a*) and between the second sensing mass (108) and the respective first sensing terminal (111*a*) and second capacitances ($C_{S2}$) between the first sensing mass (107) and the respective second sensing terminal (111*b*) and between the second sensing mass (108) and the respective second sensing terminal (111*b*); the first sensing mass (107) and the second sensing mass (108) are coupled to the respective first sensing terminals (111*a*) and second sensing terminals (111*b*) so that, due to displacements of the movable mass (5; 105) from the equilibrium position, the first capacitances ($C_{S1}$) vary concordantly from each other, the second capacitances ($C_{S2}$) vary concordantly from each other and the first capacitances ($C_{S1}$) vary discordantly with respect to the second capacitances ($C_{S2}$).

The first sensing mass (107) and the second sensing mass (108) respectively may have a first reading terminal (107*a*) and a second reading terminal (108*a*) and the control unit (103) may be configured to supply a first reading signal ($S_{R1}$) and a second reading signal ($S_R2$) respectively to the first reading terminal (107*a*) and to the second reading terminal (108*a*), the first reading signal ($S_{R1}$) and the second reading signal ($S_{R2}$) being phase-shifted by 180° with each other.

The sensing structure (107, 108) and the driving structure (110) may be specular symmetrical with respect to a median plane (P) of the movable mass (5; 105) perpendicular to the sensing axis (X).

The sensing structure (7; 107, 108) may be separated from the driving structure (10; 110) by at least one gap (36; 136, 137); the sensing structure (7; 107, 108) and the driving structure (10; 110) may have respective mechanical coupling portions (7*b*, 10*b*; 107*b*, 108*b*, 110*b*); the mechanical coupling portions (7*b*, 10*b*; 107*b*, 108*b*, 110*b*) of the driving structure (10; 110) and of the sensing structure (7; 107, 108) may be superimposed on each other; the movable mass (5; 105) may include at least one mechanical coupling structure (34; 134, 135) rigidly connecting the mechanical coupling portions (7*b*, 10*b*; 107*b*, 108*b*, 110*b*) of the driving structure (10; 110*b*) and of the sensing structure (7; 107, 108) to each other across the at least one gap (36; 136, 137).

The control unit (3; 103) may be configured to apply reading signals ($S_R$; $S_{R1}$, $S_{R2}$) to the sensing structure (7; 107, 108) and a direct voltage ($V_D$) to the driving structure (10; 110), the direct voltage ($V_D$) being independent of an average value of the reading signals ($S_R$; $S_{R1}$, $S_{R2}$).

A microelectromechanical accelerometer may be summarized as including: a microstructure, wherein the microstructure includes: a supporting body having first sensing terminals, second sensing terminals, a first driving terminal, and a second driving terminal; a moveable mass coupled to the supporting body, the moveable mass configured to oscillate along a sensing axis, and includes: a first sensing mass; and a second sensing mass, the first and second sensing masses form a sensing structure and a driving structure, wherein the first sensing mass, the second sensing mass, and the driving structure are electrically insulated from each other and are all mechanically coupled; and a control unit, wherein the control unit includes: a charge-to-voltage converter; a controller; and a driver stage, the control unit coupled to the microstructure so as to form a force feedback loop configured to maintain the moveable mass in a rest position.

The charge-to-voltage converter may be an operational amplifier in charge integrator configuration and coupled to the microstructure and configured to receive charge packets in response to switching of reading signals, the charge-to-voltage converter configured to convert the received charge packets into a sensing signal.

A device may be summarized as including: a microelectromechanical accelerometer, including: a microstructure provided with sensing terminals and driving terminals distinct from the sensing terminals and including a supporting body and a movable mass, coupled to the supporting body so as to be able to oscillate according to a sensing axis with respect to a rest position; and a control unit coupled to the microstructure so as to form a force feedback loop configured to maintain the movable mass in the rest position; wherein the movable mass includes: a sensing structure coupled to the sensing terminals through a sensing capacitive coupling variable as a function of displacements of the movable mass from the rest position; and a driving structure coupled to the driving terminals through a driving capacitive coupling variable as a function of displacements of the movable mass from the rest position; wherein the sensing structure and the driving structure are electrically insulated from and rigidly coupled to each other.

The various embodiments described above can be combined to provide further embodiments. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A microelectromechanical accelerometer, comprising:

a microstructure, having sensing terminals and driving terminals distinct from the sensing terminals and including a supporting body and a movable mass, coupled to the supporting body; and a control unit coupled to the microstructure, the control unit configured to form a force feedback loop configured to maintain the movable mass in the rest position;

wherein the movable mass comprises:

a sensing structure coupled to the sensing terminals through a sensing capacitive coupling variable as a function of displacements of the movable mass from a rest position; and a driving structure coupled to the driving terminals through a driving capacitive coupling variable as a function of displacements of the movable mass from the rest position;

wherein the sensing structure and the driving structure are electrically insulated from and rigidly coupled to each other.

2. The accelerometer according to claim 1, wherein the control unit is coupled to the sensing terminals and the driving terminals of the movable mass and is configured to sense displacements of the movable mass from the rest position through the sensing terminals and to apply feedback forces to the movable mass through feedback signals supplied to the driving terminals.

3. The accelerometer according to claim 2, wherein the control unit comprises:

a sensing device coupled to the sensing terminals of the movable mass and configured to supply a sensing signal as a function of the displacements of the movable mass from the rest position; and a control device coupled to the driving terminals of the movable mass and configured to supply the feedback signals as a function of the sensing signal.

4. The accelerometer according to claim 1, wherein the microstructure comprises fixed driving electrodes rigidly connected to the supporting body and coupled to the driving terminals and wherein the driving structure is capacitively coupled to the fixed driving electrodes through the driving capacitive coupling in a differential manner.

5. The accelerometer according to claim 4, wherein the fixed driving electrodes are defined by flat semiconductor plates perpendicular to a sensing axis, wherein the driving structure has a through opening and wherein the fixed driving electrodes are accommodated inside the through opening of the driving structure and are capacitively coupled to respective walls of the through opening.

6. The accelerometer according to claim 1, wherein the microstructure comprises fixed sensing electrodes rigidly connected to the supporting body and coupled to the sensing terminals and wherein the sensing structure is capacitively coupled to the fixed sensing electrodes through the sensing capacitive coupling in a differential manner.

7. The accelerometer according to claim 6, wherein the fixed sensing electrodes are defined by flat semiconductor plates substantially perpendicular to a sensing axis, wherein the sensing structure has a through opening and wherein the fixed sensing electrodes are inside the through opening of the sensing structure and are capacitively coupled to respective walls delimiting the through opening and substantially perpendicular to the sensing axis.

8. The accelerometer according to claim 1, wherein the sensing structure comprises a first sensing mass and a second sensing mass, both rigidly coupled to the driving structure and electrically insulated from the driving structure and from each other.

9. The accelerometer according to claim 8, wherein:

the sensing terminals comprise first sensing terminals and second sensing terminals;

the first sensing mass is capacitively coupled to a respective one of the sensing terminals and a respective one of the second sensing terminals;

the second sensing mass is capacitively coupled to a respective one of the first sensing terminals, distinct from the first sensing terminal of the first sensing mass, and to a respective one of the second sensing terminals, distinct from the second sensing terminal of the first sensing mass;

the first sensing terminal of the first sensing mass and the second sensing terminal of the second sensing mass are coupled to a first reading input of the control unit;

the first sensing terminal of the second sensing mass and the second sensing terminal of the first sensing mass are coupled to a second reading input of the control unit.

10. The accelerometer according to claim 9, wherein:

the fixed sensing electrodes comprise first fixed sensing electrodes and second fixed sensing electrodes;

the first sensing mass is capacitively coupled to a respective one of the first fixed sensing electrodes and to a respective one of the second fixed sensing electrodes;

the second sensing mass is capacitively coupled to a respective one of the first fixed sensing electrodes, distinct from the first fixed sensing electrode coupled to the first sensing mass, and to a respective one of the second fixed sensing electrodes, distinct from the second fixed sensing electrode coupled to the first sensing mass.

11. The accelerometer according to claim 10, wherein:

the first sensing mass and the second sensing mass each have a respective through opening;

the first fixed sensing electrode and the second fixed sensing electrode coupled to the first sensing mass are accommodated inside the through opening of the first sensing mass;

the first fixed sensing electrode and the second fixed sensing electrode coupled to the second sensing mass are inside the through opening of the second sensing mass; and the first fixed sensing electrodes and second fixed sensing electrodes are capacitively coupled to respective walls delimiting the through openings and substantially perpendicular to a sensing axis wherein the first fixed sensing electrodes and second fixed sensing electrodes are respectively accommodated.

12. The accelerometer according to claim 10, wherein:

the first fixed sensing electrode and the second fixed sensing electrode coupled to the first sensing mass are respectively connected to the first sensing terminal and to the second sensing terminal of the first sensing mass; and the first fixed sensing electrode and the second fixed sensing electrode coupled to the second sensing mass are respectively connected to the first sensing terminal and to the second sensing terminal of the second sensing mass.

13. The accelerometer according to claim 9, wherein:

the sensing capacitive coupling comprises first capacitances between the first sensing mass and the respective first sensing terminal and between the second sensing mass and the respective first sensing terminal and second capacitances between the first sensing mass and the respective second sensing terminal and between the second sensing mass and the respective second sensing terminal;

the first sensing mass and the second sensing mass are coupled to the respective first sensing terminals and second sensing terminals so that, due to displacements of the movable mass from the equilibrium position, the first capacitances vary concordantly from each other, the second capacitances vary concordantly from each other and the first capacitances vary discordantly with respect to the second capacitances.

14. The accelerometer according to claim 8, wherein the first sensing mass and the second sensing mass respectively have a first reading terminal and a second reading terminal and the control unit is configured to supply a first reading signal and a second reading signal respectively to the first reading terminal and to the second reading terminal, the first reading signal and the second reading signal being phase-shifted by 180° with each other.

15. The accelerometer according to claim 8, wherein the sensing structure and the driving structure are specular symmetrical with respect to a median plane of the movable mass substantially perpendicular to a sensing axis.

16. The accelerometer according to claim 1, wherein:

the sensing structure is separated from the driving structure by at least one gap;

the sensing structure and the driving structure have respective mechanical coupling portions;

the mechanical coupling portions of the driving structure and of the sensing structure are superimposed on each other;

the movable mass comprises at least one mechanical coupling structure rigidly connecting the mechanical coupling portions of the driving structure and of the sensing structure to each other across the at least one gap.

17. The accelerometer according to claim 1, wherein the control unit is configured to apply reading signals to the sensing structure and a direct voltage to the driving structure, the direct voltage being independent of an average value of the reading signals.

18. A microelectromechanical accelerometer, comprising:

a microstructure that includes:

a supporting body having first sensing terminals, second sensing terminals, a first driving terminal, and a second driving terminal;

a moveable mass coupled to the supporting body, the moveable mass configured to oscillate along a sensing axis, and includes:

a first sensing mass; and a second sensing mass, the first and second sensing masses configured to form a sensing structure and a driving structure, wherein the first sensing mass, the second sensing mass, and the driving structure are electrically insulated from each other and are all mechanically coupled; and a control unit, wherein the control unit includes:

a charge-to-voltage converter;

a controller; and a driver stage, the control unit coupled to the microstructure and configured to form a force feedback loop configured to maintain the moveable mass in a rest position.

19. The accelerometer according to claim 18, wherein the charge-to-voltage converter is an operational amplifier in charge integrator configuration and coupled to the microstructure and configured to receive charge packets in response to switching of reading signals, the charge-to-voltage converter configured to convert the received charge packets into a sensing signal.

20. A device, comprising:

a microelectromechanical accelerometer that includes:

a microstructure, provided with sensing terminals and driving terminals distinct from the sensing terminals and including a supporting body and a movable mass, coupled to the supporting body and configured to oscillate according to a sensing axis with respect to a rest position; and a control unit coupled to the microstructure and configured to form a force feedback loop configured to maintain the movable mass in the rest position;

wherein the movable mass comprises:

a sensing structure coupled to the sensing terminals through a sensing capacitive coupling variable as a function of displacements of the movable mass from the rest position; and a driving structure coupled to the driving terminals through a driving capacitive coupling variable as a function of displacements of the movable mass from the rest position;

wherein the sensing structure and the driving structure are electrically insulated from and rigidly coupled to each other.

21. The accelerometer according to claim 20, wherein the control unit is coupled to the sensing terminals and the driving terminals of the movable mass and is configured to sense displacements of the movable mass from the rest position through the sensing terminals and to form the force feedback loop to the movable mass through feedback signals supplied to the driving terminals.

* * * * *